: United States Patent (10) Patent No.: US 7,933,359 B2
Lee et al. (45) Date of Patent: Apr. 26, 2011

(54) POLAR TRANSMITTER FOR INCREASING MODULATION RATE USING MULTI-PHASE GENERATOR

(75) Inventors: Jeong-hoon Lee, Yongin-si (KR); Seung-woo Kim, Yongin-si (KR); Jae-sup Lee, Yongin-si (KR); Eun-chul Park, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1177 days.

(21) Appl. No.: 11/607,877

(22) Filed: Dec. 4, 2006

(65) Prior Publication Data

US 2007/0291875 A1 Dec. 20, 2007

(30) Foreign Application Priority Data

Jun. 16, 2006 (KR) ........................ 10-2006-0054560

(51) Int. Cl.
*H04L 27/20* (2006.01)
(52) U.S. Cl. ........................ 375/308; 375/302
(58) Field of Classification Search .................. 375/269, 375/268, 259, 308
See application file for complete search history.

(56) References Cited

U.S. PATENT DOCUMENTS

| | | | |
|---|---|---|---|
| 6,160,856 A | 12/2000 | Gershon | |
| 6,384,654 B1* | 5/2002 | Noufer | 327/276 |
| 2003/0215026 A1* | 11/2003 | Hietala | 375/297 |
| 2006/0119493 A1 | 6/2006 | Tal et al. | |
| 2007/0194820 A1* | 8/2007 | Duggal | 327/158 |

FOREIGN PATENT DOCUMENTS

WO 2006/033722 A2 3/2006

* cited by examiner

*Primary Examiner* — Shuwang Liu
*Assistant Examiner* — Michael R Neff
(74) *Attorney, Agent, or Firm* — Sughrue Mion, PLLC

(57) ABSTRACT

Provided is a polar transmitter which increases a modulation rate using a multi-phase generator and includes: a data processor which processes and separates incoming data to an amplitude component and a phase component; a multi-phase generator which generates a plurality of carriers having a plurality of phase components by processing a carrier having a certain frequency; a selection output part which selects and outputs a carrier having a phase substantially equal to the phase component; and a carrier output part which synthesizes the output carrier with the amplitude component and outputs a carrier. Accordingly, the modulation rate of the carrier can be increased and the bandwidth can be extended with the related art polar transmitter. Therefore, the polar transmitter is applicable to the wideband communications, the multi-mode, and the multi-band.

4 Claims, 5 Drawing Sheets

POLAR TRANSMITTER FOR INCREASING MODULATION RATE USING MULTI-PHASE GENERATOR

CROSS-REFERENCE TO RELATED APPLICATIONS

This application claims priority from Korean Patent Application No. 10-2006-0054560, filed Jun. 16, 2006, in the Korean Intellectual Property Office, the entire contents of which is incorporated herein by reference.

BACKGROUND OF THE INVENTION

1. Field of the Invention

Apparatuses consistent with the present invention relate to a polar transmitter which increases a modulation rate using a multi-phase generator, and more particularly, to a polar transmitter which is suitable for a multi-mode and a multi-band by increasing a modulation rate using a multi-phase generator.

2. Description of the Related Art

A typical spread spectrum transmitter uses sine waves or pulses as a carrier to convey information, by increasing the sine waves or the pulses to a certain frequency. In order to perform the increase in frequency, the transmitter requires components which up-convert the carrier from a baseband to the certain frequency.

To up-convert the carrier to the certain frequency, the transmitter can adopt a superheterodyne principle which up-converts from the baseband to a certain frequency via an intermediate band and a direct conversion principle which converts the baseband directly to a certain frequency.

A superheterodyne transmitter requires an intermediate frequency (IF) voltage controller oscillator (VCO) for generating frequencies of the IF band, a radio frequency (RF) VCO for generating frequencies of the RF band, an IF phase locked loop (PLL) and a RF PLL which fix the frequencies generated at the VCOs not to be affected by external factors, an IF up-mixer which up-converts the carrier of the baseband to the IF band of the frequencies generated at the VCOs, and a RF up-mixer which up-converts the carrier of the IF band to a certain frequency band. In addition, the superheterodyne transmitter requires a surface acoustic wave (SAW) filter for eliminating image signals and a power amplifier (PA) having good linearity. Such a superheterodyne transmitter is disadvantageous in that a number of circuit parts complicate the circuitry and their coordination.

A direct conversion transmitter requires a VCO, a PLL, an up-mixer, and a PA. As such, the number of the circuit parts of the direction conversion transmitter is smaller than that of the superheterodyne transmitter. Still, the good linearity of the PA is required and a separate filtering means should be provided at the back end of the PA to meet the noise level required by the GSM standard. Additionally, noise due to DC components is disadvantageous and the signal quality is deteriorated due to mismatch of an in-phase (I) signal and a quadrature (Q) signal.

To overcome the shortcomings of the superheterodyne transmitter and the direct conversion transmitter, a polar transmitter has been suggested.

The polar transmitter separates data of I signal and Q signal to an amplitude component and a phase component for processing. The polar transmitter includes a modulator 10, a PLL 20, a VCO 30, a PA 40, an amplitude control loop 50, and a phase control loop 60, as shown in FIG. 1.

The modulator 10 receives the I signal and the Q signal and separates them to the amplitude component and the phase component. The PLL 20 generates a control signal so that the VCO 30 outputs a carrier of a frequency having a phase that matches to the input phase component.

The PA 40 receives the generated carrier from the VCO 30 and an amplitude control signal from the amplitude control loop 50 and then outputs a carrier. The carrier produced from the PA 40 has an intended phase and an intended amplitude.

The amplitude control loop 50 generates the amplitude control signal to be applied to the PA 50 by processing the amplitude component separated at the modulator 10. The amplitude control loop 50 analyzes the amplitude of the carrier output from the PA 40 and provides the amplitude control signal for the amplitude control to the PA 40 according to the amplitude analysis.

The phase control loop 60 analyzes the phase of the carrier output from the PA 40 and provides a signal for controlling the phase to the PLL 20 according to the analysis.

The related art polar transmitter utilizes the PLL 20 to generate the carrier, and the PLL 20 has a feedback circuit so that the VCO 20 generates the carrier having the exact frequency and phase. The feedback circuit of the PLL 20 operates every time the amplitude and the phase of the carrier are modulated. At every phase modulation, it takes a time to compare the phases in the feedback circuit. The related art polar transmitter further includes two more feedback circuits of the amplitude control loop 50 and the phase control loop 60, in addition to the feedback circuit of the PLL 20. Accordingly, the entire modulation for the carrier output takes a long time.

Meanwhile, with advances and diversity of communication standards for the radio communications, a transceiver for radio communications is required which can not only operate in different modes but also comply with one or more standards or frequency bands. For instance, a new radio communication transceiver is required to support CDMA 1X and/or General Packet Radio Service (GPRS), global system for mobile communications (GSM), and Wideband Code Division Multiple Access (WCDMA).

To support the multi-band capability, one or more reference oscillators are required in a single transceiver. To this end, in the related art, two separate PLLs 20 and a switch between them are provided. However, such a design increases the size and the cost and degrades the design efficiency.

To address these disadvantages, a multi-mode radio communication transceiver requires one or more VCOs 30 and a PLL 20 that can operate in the multiple frequencies to support the diverse standards. Yet, the time delay due to the feedback circuit of the PLL 20 is not suitable for the PLL 20 in a wideband system.

Therefore, what is needed is a circuit that can operate at a high rate and promptly modulate a new frequency even when changing to a different mode.

SUMMARY OF THE INVENTION

Exemplary embodiments of the present invention overcome the above disadvantages and other disadvantages not described above. Also, the present invention is not required to overcome the disadvantages described above, and an exemplary embodiment of the present invention may not overcome any of the problems described above.

An aspect of the present invention provides a polar transmitter which is suitable to a multi-mode and a multi-band by increasing a modulation rate.

Another aspect of the present invention also provides a polar transmitter includes a data processor which processes and separates incoming data to an amplitude component and a phase component; a multi-phase generator which generates a plurality of carriers having a plurality of phase components by processing a carrier having a certain frequency; a selection output part which selects and outputs a carrier having a phase substantially equal to the phase component; and a carrier output part which synthesizes the output carrier with the amplitude component and outputs a carrier to be transmitted.

The data processor may include a data separator which separates the data to an I signal and a Q signal; a pair of pulse shaping filters which restrict frequency bands of the I signal and the Q signal, respectively; and a Coordinate Rotation Digital Computer (CORDIC) which separates the pulse-shaped I and Q signals to the phase component and the amplitude component.

The data separator may be a MODEM.

The polar transmitter may further include a frequency synthesizer which generates the carrier and provides the generated carrier to the multi-phase generator.

The plurality of the carriers processed at the multi-phase generator may have a constant phase difference.

The multi-phase generator may be a delay-locked loop (DLL).

The DLL may include a plurality of delay blocks which delay a signal by the constant phase difference, and a feedback part which receives signals output from the delay blocks and adjusts a voltage applied to the delay blocks.

The polar transmitter may further include a controller which provides the selection output part with a control signal to select one of carriers generated at the multi-phase generator according to the phase component.

The selection output part may be a MUX.

The polar transmitter may further include a buffer or limiter which eliminates noise of the carrier output from the selection output part.

The carrier output part may be a switching power amplifier.

The polar transmitter may further include an amplitude modulator which generates an amplitude control signal matching to the amplitude component and provides the generated amplitude control signal to the carrier output part.

The carrier output part may adjust and output the amplitude of the carrier output from the selection output part according to the amplitude control signal from the amplitude modulator.

The polar transmitter may further include a phase smoother which prevents abrupt change of the phase of the carrier output from the selection output part.

BRIEF DESCRIPTION OF THE DRAWINGS

The above and other aspects of the present invention will become more apparent by describing in detail exemplary embodiments thereof with reference to the attached drawing figures, wherein.

DETAILED DESCRIPTION OF EXEMPLARY EMBODIMENTS OF THE PRESENT INVENTION

Figure 1:
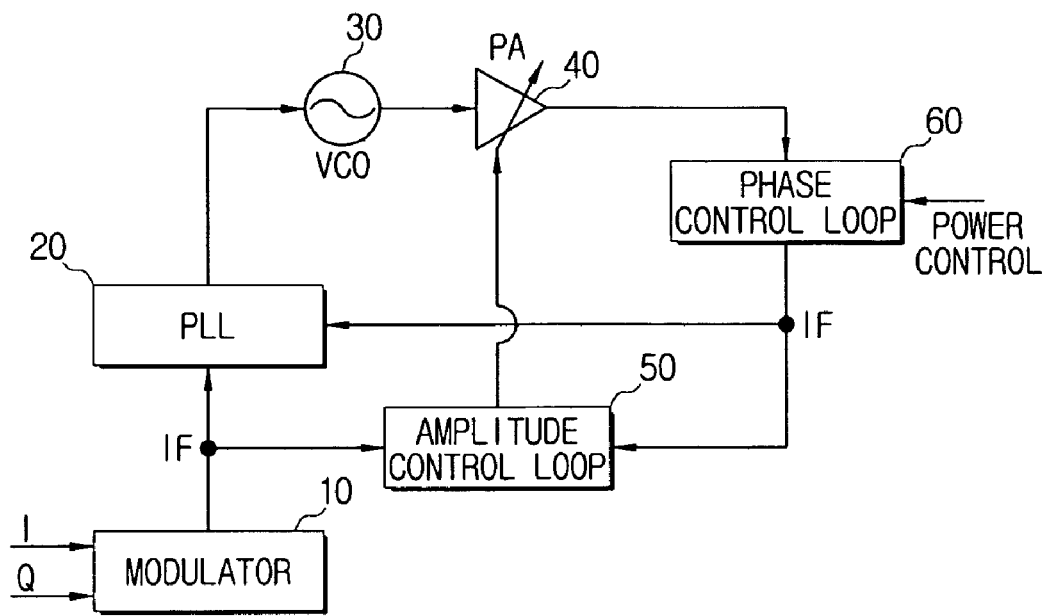
FIG. 1 is a simplified circuit diagram of a related art polar transmitter.

Hereinafter, exemplary embodiments of the present invention will be described in detail with reference to the accompanying drawing figures.

In the following description, the same drawing reference numerals are used to refer to the same elements, even in different drawings. The matters defined in the following description, such as detailed construction and element descriptions, are provided as examples to assist in a comprehensive understanding of the invention. Also, well-known functions or constructions are not described in detail, since they would obscure the invention in unnecessary detail.

Figure 2:
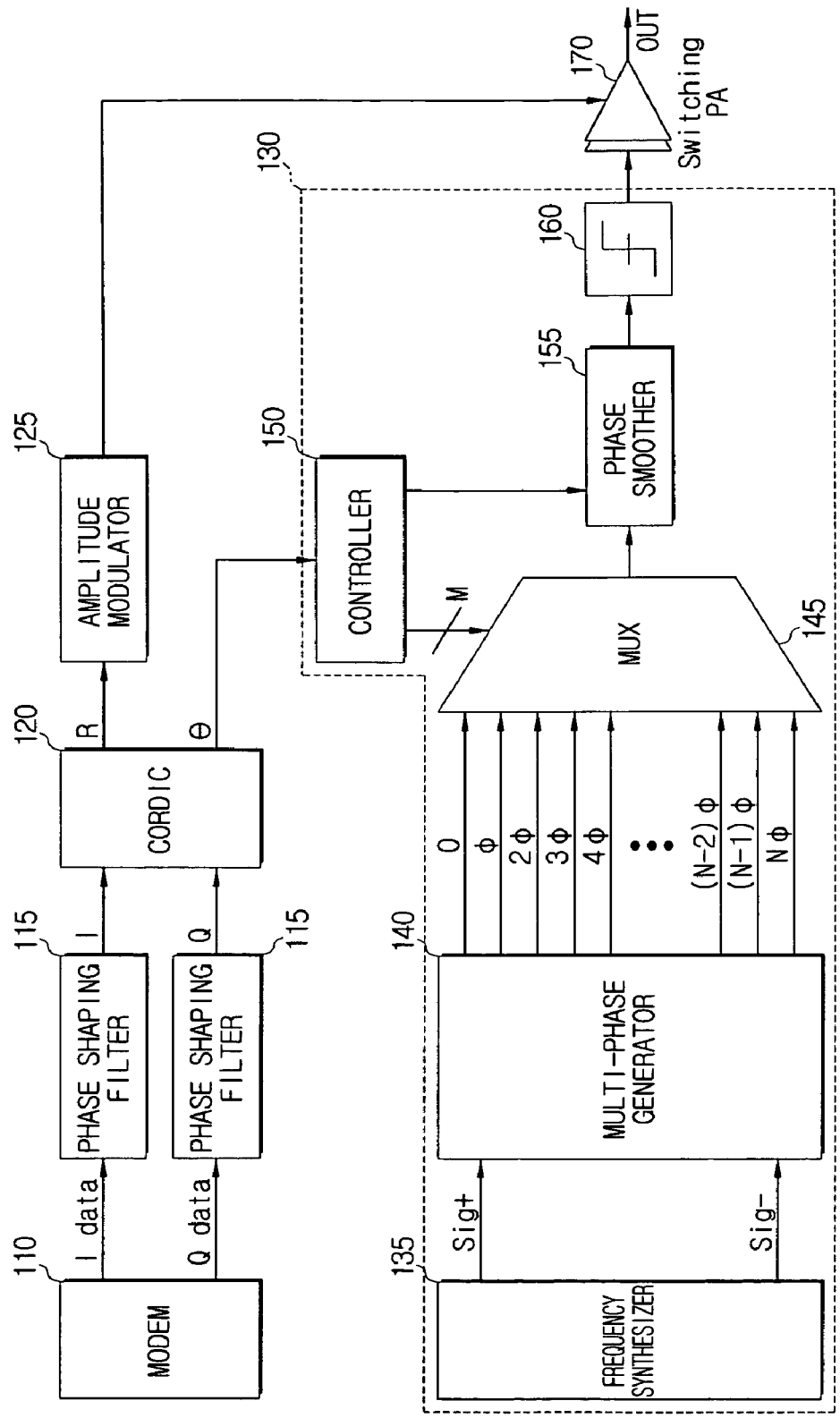
FIG. 2 is a simplified circuit diagram of a polar transmitter according to an exemplary embodiment of the present invention.

FIG. 2 is a simplified circuit diagram of a polar transmitter according to an exemplary embodiment of the present invention. The polar transmitter includes a MODEM 110, a pair of pulse shaping filters 115, a coordinate rotation digital computer (CORDIC) 120, an amplitude modulator 125, a phase processing circuit 130, and a switching power amplifier (PA) 170.

The MODEM 110 receives data to be transmitted and splits it to an in-phase (I) signal and a quadrature (Q) signal.

The pulse shaping filters 115 restricts frequency bands of the I signal and the Q signal, respectively. Accordingly, when the pulse clock is changed from "0" to "1" or from "1" to "0", that is, when the phase is inverted by 180 degrees, the radiation of the frequency spectrum can be prevented.

The CORDIC 120 receives the I signal and the Q signal processed at the pulse shaping filters 115 and separates them to a phase component and an amplitude component. In more detail, the CORDIC 120 converts data bits represented as coordinate components on the I-signal axis and the Q-signal axis to the amplitude component and the phase component.

The amplitude modulator 125 receives the amplitude component from the CORDIC 120 and generates an amplitude control signal for controlling the output level of the switching PA 170. The amplitude modulator 125 outputs an amplitude control signal which controls the switching PA 170 to output a carrier with the output level matching to the amplitude component.

The phase processing circuit 130 receives and processes the phase component from the CORDIC 120. The phase processing circuit 130 includes a controller 150, a frequency synthesizer 135, a multi-phase generator 140, a MUX 145, a buffer or limiter 160, and a phase smoother 155.

The frequency synthesizer 135 generates a carrier of a specific frequency required to convey the data. The frequency synthesizer 135 functions as a related art PLL. While the PLL is incapable of carrying out the rapid frequency conversion due to the presence of the feedback loop, the frequency synthesizer 135 without the feedback loop does not require the VCO. Thus, the phase noise generated at the VCO is low and the frequency resolution of the output waveform is higher than the PLL. The frequency synthesizer 135 is suitable for CDMA 1X, GPS and/or GSM/GPRS, WCDMA, and the multi-mode.

The multi-phase generator 140 receives the carrier from the frequency synthesizer 135 and outputs a plurality of carriers having various phases by processing the received carrier. The multi-phase generator 140 outputs the carriers having the phase difference Φ at intervals. The phase difference and the number of the output carriers are changeable by a designer. The multi-phase generator 140 may employ a delay-locked loop (DLL).

Figure 3:
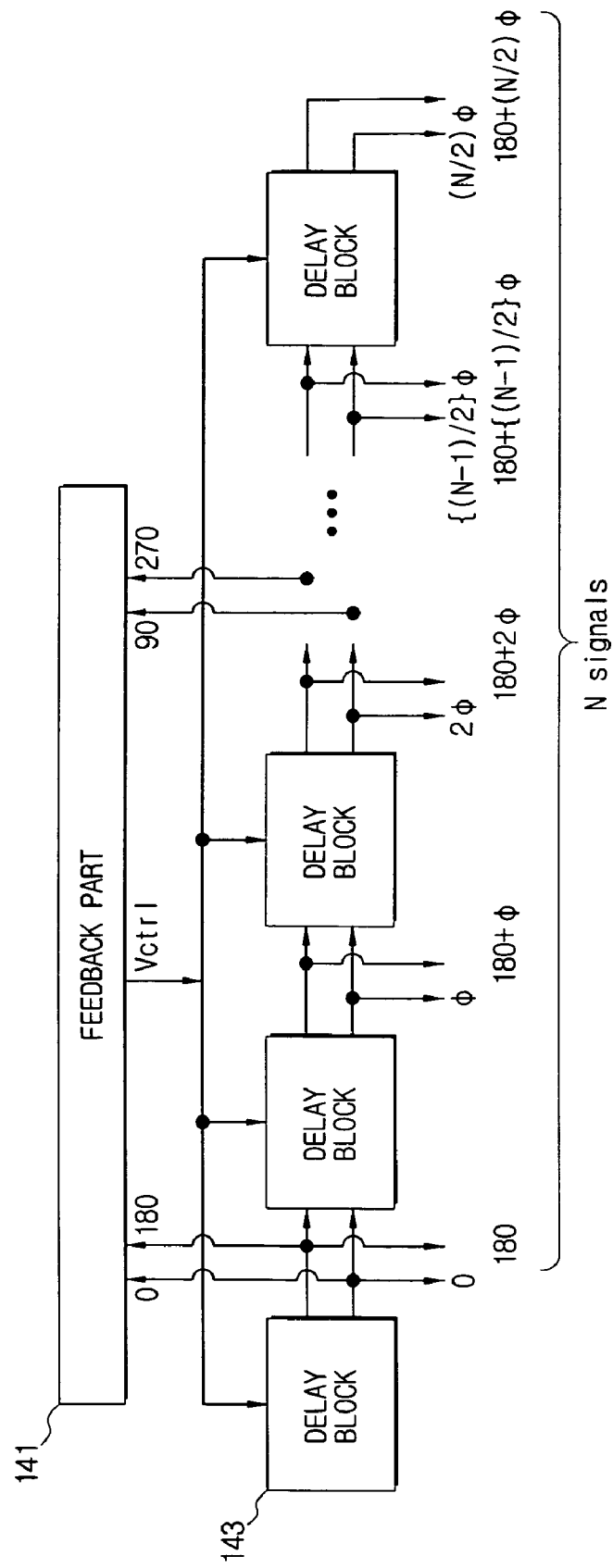
FIG. 3 is a circuit diagram of the delay-locked loop (DLL) of FIG. 2.

The DLL 140, as shown in FIG. 3, includes a plurality of delay blocks 143 and a feedback part 141. The delay blocks 143 delay the carriers by the phase, and the feedback part 141 controls the voltage supply to the delay blocks 143.

The delay blocks 143 are arranged in a line. The carrier is input to the first delay block 143 and sequentially processed up to the last delay block 143. Herein, the first delay block 143 processes the carrier such that the phase of the carrier is 0 and 180 degrees, the second delay block 143 to the last delay block 143 process the carrier to delay the phase of the carrier by a preset phase. The carriers phase-processed at the delay blocks 143 are applied to the MUX 145. Specific carriers among the processed carriers, for example, carriers having the phase of 0, 90, 180, and 270 degrees are fed back to the feedback part 141.

The feedback part 141 receives and compares part of the carriers processed at the delay blocks 143. According to a result of the comparison, when the carriers do not have the constant phase difference, the feedback part 141 adjusts the voltage input to the delay blocks 143 to make the constant phase difference. For instance, when the phase of the carriers to be fed back to the feedback part 141 is 0, 90, 180, and 270 degrees, the phase difference of the carriers should be 90 degrees. When the phase difference of the carriers is not 90 degrees, the feedback part 141 adjusts the voltage to make the phase difference of the carriers 90 degrees.

As such, the plurality of the carriers with the different phases is generated at the DLL 140, and the number of the generated carriers is determined by the number of the delay blocks 143. Since the DLL 140 produces the plurality of the carriers with the different phases, the stepwise conversion from one symbol to another symbol is feasible.

The MUX 145 receives the generated carriers from the DLL 140, selects and outputs one of the received carriers according to the control signal of the controller 150. In doing so, the MUX 145 outputs the carrier having the same phase as the phase selected by the controller 150. Alternatively, when there is no carrier with the same phase, the MUX 145 outputs the carrier having a phase substantially equal to the phase selected by the controller 150.

The controller 150 determines the phase of the carrier based on the phase component output from the CORDIC 120 and outputs a control signal so that the MUX 145 outputs the carrier having the corresponding phase.

The buffer or limiter 160 eliminates noise from the carrier output from the MUX 145.

The phase smoother 155 receives the noise-free carrier and prevents the abrupt phase change. Accordingly, the spectral characteristics can be enhanced.

The switching PA 170 receives the processed carrier from the phase smoother 155 and the amplitude control signal from the amplitude modulator 125. Hence, the switching PA 170 outputs the carrier with the selected phase. Particularly, the switching PA 170 outputs the carrier having the selected phase and amplitude by adjusting the amplitude of the carrier.

Data processing at the polar transmitter as constructed above is now described.

The data input to the MODEM 110 is separated to the I signal and the Q signal and applied to the pulse shaping filters 115, respectively. The pulse shaping filters 115 respectively restrict the I signal and the Q signal and provide the signals to the CORDIC 120. The CORDIC 120 separates the I signal and the Q signal to the phase component and the amplitude component. The phase component is applied to the controller 150, and the amplitude component is applied to the amplitude modulator 125. The amplitude modulator 125 generates the amplitude control signal to control the switching PA 170.

The frequency synthesizer 135 generates a carrier having a certain frequency and applies the generated carrier to the multi-phase generator 140. The multi-phase generator 140 generates a plurality of carriers having different phases and provides the generated carriers to the MUX 145. The MUX 145 selects and outputs a carrier having a phase substantially equal to the phase component split at the CORDIC 120 according to the control signal from the controller 150. The output carrier passes through the noise removal at the buffer or limiter 160 and the abrupt phase change at the phase smoother 155, and then applied to the switching PA 170. The switching PA 170 adjusts the amplitude of the incoming carrier according to the amplitude control signal of the amplitude modulator 125 and outputs the adjusted carrier. Consequently, the carrier having the intended phase and amplitude is produced.

Figure 4:
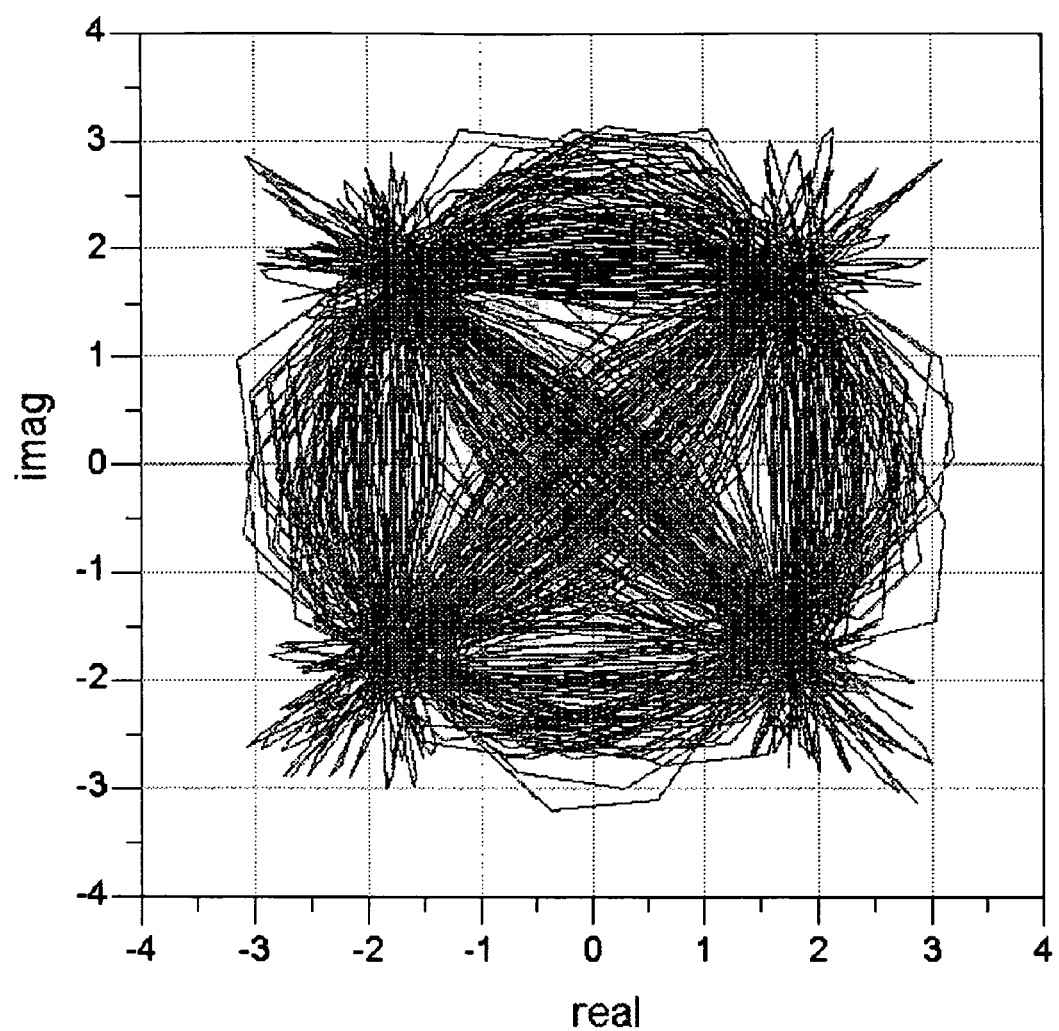
FIG. 4 is a graph showing a carrier locus output from the polar transmitter according to an exemplary embodiment of the present invention.
Figure 5:
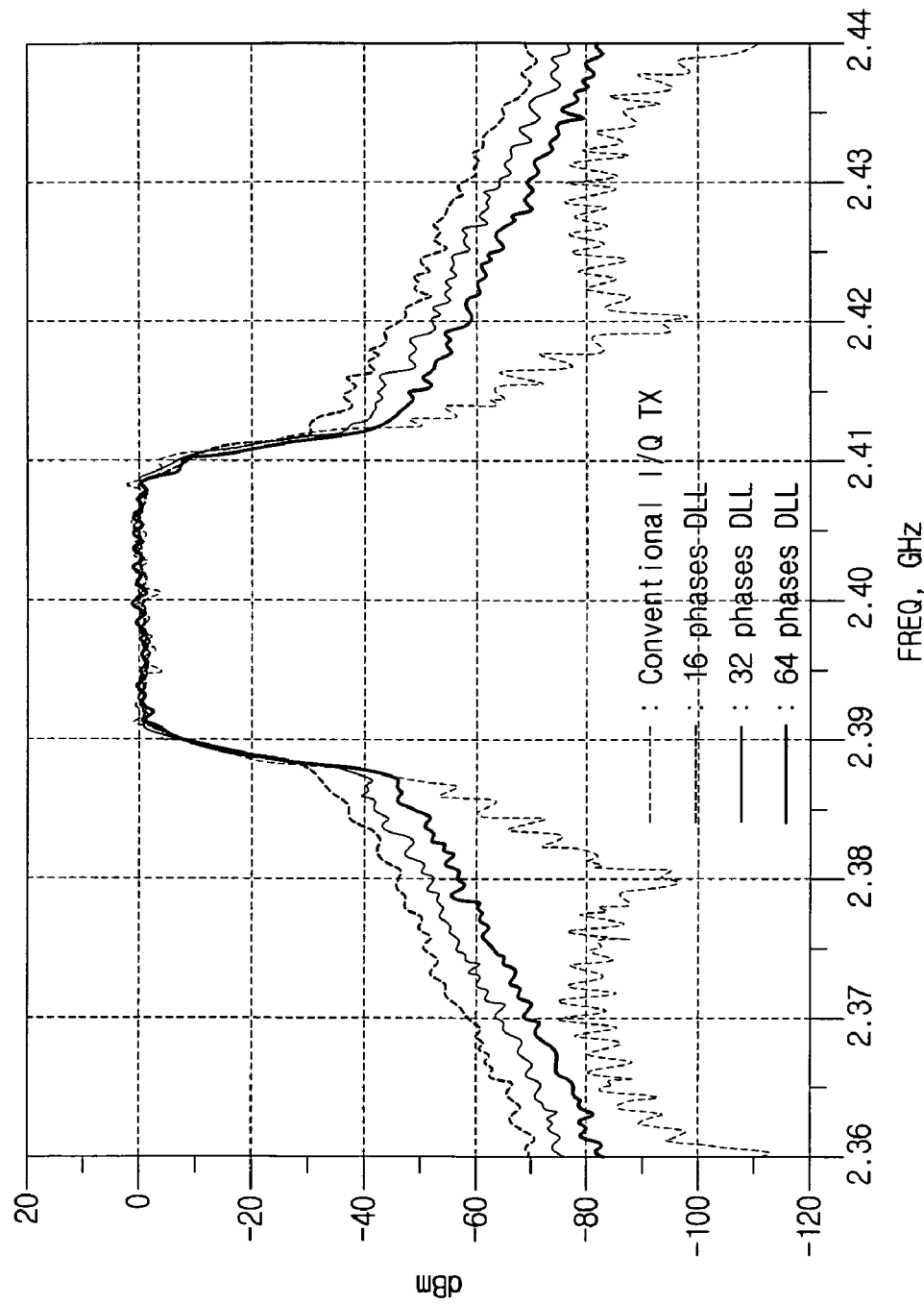
FIG. 5 is a graph comparing spectrum performance of the polar transmitter of the exemplary embodiment of the present invention and the related art transmitter.

FIG. 4 is a graph showing a carrier locus output from the polar transmitter according to an exemplary embodiment of the present invention, and FIG. 5 is a graph comparing a spectrum performance between the polar transmitter of the exemplary embodiment of the present invention and the related art transmitter. The graphs of FIGS. 4 and 5 show the experimental results without the phase smoother 155.

Referring first to FIG. 4, the carrier emitted from the polar transmitter of the exemplary embodiment of the present invention is concentrated in four spots on the coordinates. The four spots are connected through diverse curves. Accordingly, when using the polar transmitter, it is possible to produce the carrier having the accurate amplitude component and phase component and the frequency spectrum is not radiated.

Referring now to FIG. 5, the polar transmitter of the exemplary embodiment of the present invention generates the same frequency bandwidth 20 MHz as the related art transmitter, which is far more prominent than the bandwidth 200 KHz of the related art polar transmitter. Also, the polar transmitter of the exemplary embodiment of the present invention exhibits the different performance depending on the number of the carriers output from the DLL 140. Notably, the greater number of the output carriers, the better performance of the polar transmitter.

As such, the polar transmitter of the exemplary embodiment of the present invention employs the frequency synthesizer 135 and the multi-phase generator 140, rather than the PLL used in the related art polar transmitter. As for the PLL, the feedback takes some time because it is necessary to pass through the feedback circuit all the time to generate the carrier having the intended phase. By contrast, it takes a time for the multi-phase generator 140 to produce the plurality of the carriers having the different phases. Afterwards, since the carriers are constantly output, the carrier output from the MUX 145 is merely selected. Therefore, the carrier modulation rate can be drastically increased. Furthermore, with the bandwidth extended more than 100 times as comparing to the related art polar transmitter, the polar transmitter of the exemplary embodiment of the present invention is applicable to the wideband communications.

The polar transmitter of the exemplary embodiment of the present invention does not require the feedback circuit for the modulation of the amplitude and the phase. Thus, its cost can be lowered by removing circuit parts that have been used for the feedback of the amplitude and the phase at the related art polar transmitter.

As set forth above, according to the exemplary embodiment of the present invention, the modulation rate of the carrier can be drastically increased and the bandwidth can be extended more than 100 times as comparing with the related art polar transmitter. Therefore, the polar transmitter is applicable to the wideband communications, the multi-mode, and the multi-band. Furthermore, its design can be simplified and its cost can be reduced.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A polar transmitter comprising:
a data processor which separates incoming data into an amplitude component and a phase component;
a multi-phase generator which generates a plurality of carriers comprising a plurality of phase components by processing a first carrier comprising a certain frequency;
a selection output part which selects and outputs a second carrier comprising a phase substantially equal to the phase component;
a carrier output part which synthesizes the second carrier with the amplitude component and outputs a third carrier,
wherein the multi-phase generator comprises a plurality of delay blocks which delay a signal by a constant phase difference, and a feedback part which receives signals output from the plurality of delay blocks and adjusts a voltage applied to the plurality of delay blocks, and
wherein the polar transmitter further comprises a buffer which eliminates noise of the third carrier.

2. A polar transmitter comprising:
a data processor which separates incoming data into an amplitude component and a phase component;
a multi-phase generator which generates a plurality of carriers comprising a plurality of phase components by processing a first carrier comprising a certain frequency;
a selection output part which selects and outputs a second carrier comprising a phase substantially equal to the phase component;
a carrier output part which synthesizes the second carrier with the amplitude component and outputs a third carrier,
wherein the multi-phase generator comprises a plurality of delay blocks which delay a signal by a constant phase difference, and a feedback part which receives signals output from the plurality of delay blocks and adjusts a voltage applied to the plurality of delay blocks, and
wherein the polar transmitter further comprises a limiter which eliminates noise of the third carrier.

3. A polar transmitter comprising:
a data processor which separates incoming data into an amplitude component and a phase component;
a multi-phase generator which generates a plurality of carriers comprising a plurality of phase components by processing a first carrier comprising a certain frequency;
a selection output part which selects and outputs a second carrier comprising a phase substantially equal to the phase component;
a carrier output part which synthesizes the second carrier with the amplitude component and outputs a third carrier,
wherein the multi-phase generator comprises a plurality of delay blocks which delay a signal by a constant phase difference, and a feedback part which receives signals output from the plurality of delay blocks and adjusts a voltage applied to the plurality of delay blocks,
wherein the polar transmitter further comprises an amplitude modulator which generates an amplitude control signal matching the amplitude component and provides the generated amplitude control signal to the carrier output part, and
wherein the carrier output part adjusts and outputs an amplitude of the third carrier according to the amplitude control signal from the amplitude modulator.

4. A polar transmitter comprising:
a data processor which separates incoming data into an amplitude component and a phase component;
a multi-phase generator which generates a plurality of carriers comprising a plurality of phase components by processing a first carrier comprising a certain frequency;
a selection output part which selects and outputs a second carrier comprising a phase substantially equal to the phase component;
a carrier output part which synthesizes the second carrier with the amplitude component and outputs a third carrier,
wherein the multi-phase generator comprises a plurality of delay blocks which delay a signal by a constant phase difference, and a feedback part which receives signals output from the plurality of delay blocks and adjusts a voltage applied to the plurality of delay blocks, and
wherein the polar transmitter further comprises a phase smoother which prevents abrupt change of the phase of the second carrier.

* * * * *